United States Patent
Henry

(10) Patent No.: US 9,502,079 B2
(45) Date of Patent: Nov. 22, 2016

(54) PASSIVE INTERFACE FOR AN ELECTRONIC MEMORY DEVICE

(75) Inventor: Paul D. Henry, Indianapolis, IN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 13/883,057

(22) PCT Filed: Jan. 18, 2012

(86) PCT No.: PCT/US2012/021642
§ 371 (c)(1),
(2), (4) Date: May 2, 2013

(87) PCT Pub. No.: WO2012/106112
PCT Pub. Date: Aug. 9, 2012

(65) Prior Publication Data
US 2014/0194077 A1    Jul. 10, 2014

Related U.S. Application Data

(60) Provisional application No. 61/438,521, filed on Feb. 1, 2011.

(51) Int. Cl.
*H04B 1/38* (2015.01)
*G11C 5/06* (2006.01)
(Continued)

(52) U.S. Cl.
CPC . *G11C 5/06* (2013.01); *G11C 7/10* (2013.01); *H04B 1/385* (2013.01); *H04R 1/1058* (2013.01); *H04R 1/1091* (2013.01); *H04R 29/001* (2013.01); *Y10T 29/49117* (2015.01)

(58) Field of Classification Search
CPC .............................. G11C 5/06; H04R 1/1058

USPC ........ 365/63; 29/825; 455/13.4, 90.2, 186.1, 455/558, 333

See application file for complete search history.

(56) References Cited

U.S. PATENT DOCUMENTS 4,408,353 A    10/1983    Bowen
5,148,144 A    9/1992    Sutterlin
(Continued)

FOREIGN PATENT DOCUMENTS

CN    201007654    1/2008
CN    201199695    2/2009
(Continued)

OTHER PUBLICATIONS

International Search Report, PCT/US2012/021642, mailed May 25, 2012, 3 pages.

*Primary Examiner* — Md Talukder

(57) ABSTRACT

A passive interface for connecting an electronic memory device to an exterior circuit is provided. The passive interface includes a signal connection point, a power connection point and a ground connection point on an electronic memory device. A first passive component forms an electrical connection between the signal connection point and the power connection point. A second passive component forms an electrical connection between the power connection point and the ground connection point. And the power connection point receives a conditioned voltage signal through the electrical connection between the signal connection point and the power connection point. Such a passive interface can be used in a variety of devices, including headsets for intrinsically save applications.

23 Claims, 4 Drawing Sheets

(51) Int. Cl.
*G11C 7/10* (2006.01)
*H04B 1/3827* (2015.01)
*H04R 1/10* (2006.01)
*H04R 29/00* (2006.01)

(56) References Cited

U.S. PATENT DOCUMENTS

| | | | |
|---|---|---|---|
| 5,248,908 A | 9/1993 | Kimura | |
| 5,589,813 A | 12/1996 | Nielsen | |
| 5,889,272 A | 3/1999 | Lafon | |
| 5,974,553 A * | 10/1999 | Gandar | H04L 25/02 713/300 |
| 6,148,351 A | 11/2000 | Takase | |
| 6,363,066 B1 | 3/2002 | Frimodig | |
| 6,425,030 B1 | 7/2002 | Melcher | |
| 6,609,204 B1 | 8/2003 | Olarig | |
| 6,813,671 B1 | 11/2004 | Ikeda | |
| 6,845,422 B2 | 1/2005 | Shimada | |
| 6,870,282 B1 | 3/2005 | Bischoff | |
| 6,971,032 B2 | 11/2005 | Ohie | |
| 6,989,735 B2 | 1/2006 | Fisher | |
| 7,149,906 B2 | 12/2006 | Sakai | |
| 7,158,869 B2 | 1/2007 | Vollmer | |
| 7,240,848 B1 * | 7/2007 | Dressen | G06K 19/0723 235/472.02 |
| 7,283,635 B1 | 10/2007 | Anderson | |
| 7,288,982 B1 | 10/2007 | Chang | |
| 7,327,052 B2 | 2/2008 | Korsten | |
| 7,356,715 B2 | 4/2008 | Okayasu | |
| 7,401,163 B2 | 7/2008 | Nishimoto | |
| 8,942,057 B1 * | 1/2015 | Xiao | G11C 5/143 361/784 |
| 2004/0242278 A1 * | 12/2004 | Tomoda | G08C 17/02 455/563 |
| 2005/0050248 A1 | 3/2005 | York | |
| 2005/0050390 A1 | 3/2005 | Lee | |
| 2005/0079885 A1 * | 4/2005 | Patino | H04M 1/05 455/518 |
| 2005/0116884 A1 * | 6/2005 | Kim | G06F 3/14 345/11 |
| 2005/0153731 A1 * | 7/2005 | McKinney | H04W 88/06 455/552.1 |
| 2006/0063502 A1 * | 3/2006 | Shibuya | H03L 7/02 455/255 |
| 2006/0164098 A1 | 7/2006 | Su | |
| 2007/0003098 A1 * | 1/2007 | Martenson | H04M 1/05 381/388 |
| 2008/0164994 A1 | 7/2008 | Johnson | |
| 2008/0217767 A1 * | 9/2008 | Tago | H01L 23/481 257/737 |
| 2009/0023395 A1 | 1/2009 | Chang | |
| 2009/0051404 A1 | 2/2009 | Ogasawara | |
| 2009/0185408 A1 * | 7/2009 | Takenaka | G06F 13/4077 365/63 |
| 2010/0045192 A1 * | 2/2010 | Lee | H05B 37/0218 315/152 |
| 2010/0062806 A1 | 3/2010 | Han | |
| 2010/0115149 A1 | 5/2010 | Ewer | |
| 2010/0201698 A1 * | 8/2010 | Lee | G09G 3/20 345/536 |
| 2012/0038752 A1 * | 2/2012 | Sang | G09G 3/003 348/51 |
| 2013/0335870 A1 * | 12/2013 | Kushibe | H02H 9/046 361/56 |
| 2014/0194077 A1 * | 7/2014 | Henry | G11C 7/10 455/90.2 |

FOREIGN PATENT DOCUMENTS

| | | |
|---|---|---|
| CN | 101393542 | 3/2009 |
| CN | 201230321 | 4/2009 |
| CN | 201307346 | 9/2009 |
| CN | 101639819 | 2/2010 |
| CN | 101662372 | 3/2010 |
| DE | 296 14 187 | 9/1996 |
| DE | 196 06 940 | 4/1997 |
| DE | 103 15 831 | 7/2004 |
| EP | 0 355 532 | 2/1990 |
| EP | 0 997 825 | 5/2000 |
| EP | 1 032 160 | 8/2000 |
| EP | 1 684 457 | 7/2006 |
| JP | 20-96444 | 4/1990 |
| JP | 42-20895 | 8/1992 |
| JP | 50-63708 | 3/1993 |
| JP | 6-112960 | 4/1994 |
| JP | 61-12959 | 4/1994 |
| JP | 61-19089 | 4/1994 |
| JP | 10-083494 | 3/1998 |
| JP | 10-145400 | 5/1998 |
| JP | 11-317757 | 11/1999 |
| JP | 2000-222295 | 8/2000 |
| JP | 2004-328488 | 11/2004 |
| KR | 10-2005-0073205 | 7/2005 |
| WO | WO 01/01364 | 1/2001 |
| WO | WO 2006/005784 | 1/2006 |
| WO | WO 2010/048873 | 5/2010 |

* cited by examiner

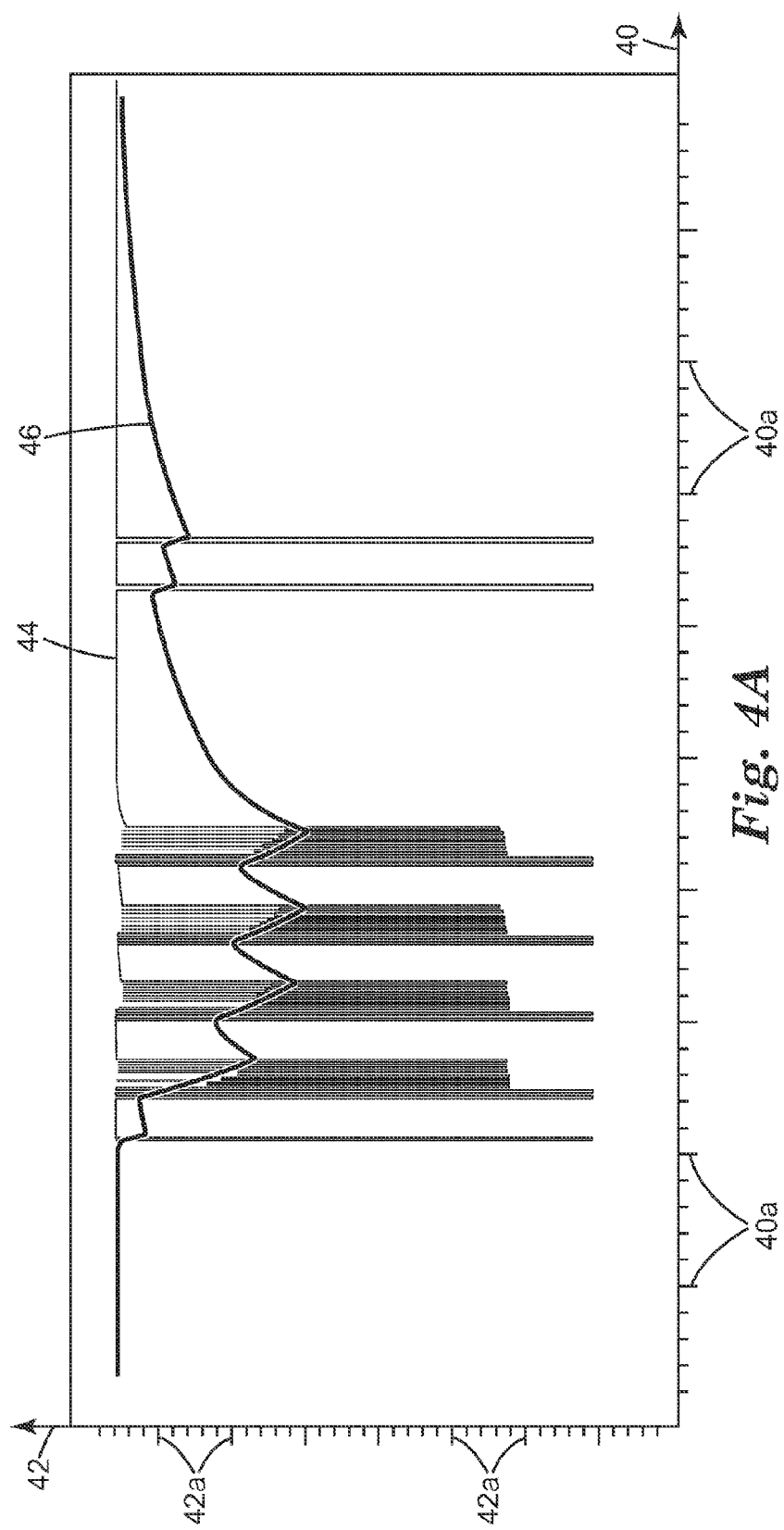

PASSIVE INTERFACE FOR AN ELECTRONIC MEMORY DEVICE

TECHNICAL FIELD

The present disclosure relates to an interface for an electronic memory device, and more specifically, a passive interface to connect an electronic memory device to an exterior circuit.

BACKGROUND

Computers and other electronic devices frequently rely on stored information. Stored information, frequently digital data, can be recorded in a memory device such as an integrated circuit chip and can be used for decision making and directing circuit actions. Random access memory (RAM) and read only memory (ROM) are two common types of memory used in electronic circuits. RAM is generally considered volatile, such that the stored data is lost if power to the memory device is lost or switched off. On the other hand, ROM is generally considered stable, but traditionally cannot be modified (or is difficult to modify). However, newer forms of ROM such as EPROM and EEPROM can be erased and reprogrammed multiple times.

When a memory device is used in an electronic device, it requires electrical connections to other points in the circuitry of the electronic device or to an external circuit. Such electrical connection points, often called pins, connect an external circuit to the electronic memory device. An increased number of lines in an interface or external circuit connected to connection points on an electronic memory device can result in a greater variety of power levels or more data lines for the memory device. However, an increased number of electrical connections can also increase risk of electrical shorts or errors and require more cost and space. An interface for a memory device with a reduced number of electrical connections to an exterior circuit would be welcomed.

SUMMARY

An interface for an electronic memory device with a reduced number of electrical connections to an exterior circuit is provided. More specifically, a passive interface for electrically connecting a signal connection point and a power connection point on an electronic memory device to an exterior circuit with single electrical connection is provided. Such an interface can provide several advantages over current interfaces for electronic memory devices. For example, requiring only one line of an exterior circuit to electrically connect to a signal connection point and a power connection point can decrease the total number of electrical connections required to connect an electronic memory device to an exterior circuit or electronic device. This in turn can decrease the amount of space required for such an interface. This can allow for benefits such as greater design flexibility or, specifically, a smaller connecting cord between an electronic memory device and other parts of a circuit.

Further, the present disclosure can provide advantages in intrinsically safe applications. An intrinsically safe device is designed so that the electronic equipment in it is protected in explosive atmospheres and under irregular operating conditions. The theory behind an intrinsically safe design is ensuring the electrical and thermal energy available in an electrical system at any given time is low enough that ignition of a hazardous atmosphere cannot occur. By decreasing the number of electrical connections from an exterior circuit required to connect to an electronic memory device, the present disclosure can contribute to an intrinsically safe system. Certifications for intrinsically safe systems can vary by country. For example, in the United States, Factory Mutual certification can be required. In Europe, directive 94/9/EC, also known as ATEX ("Atmospheres Explosibles"), governs intrinsically safe devices.

The present disclosure provides in the first instance a passive interface for an electronic memory device. The passive interface includes a signal connection point, a power connection point and a ground connection point on an electronic memory device. A first passive component forms an electrical connection between the signal connection point and the power connection point. A second passive component forms an electrical connection between the power connection point and the ground connection point. And the power connection point receives a conditioned voltage signal through the electrical connection between the signal connection point and the power connection point.

The present disclosure also provides a method of connecting an exterior circuit to an electronic memory device. The method includes electrically connecting a signal line of the exterior circuit to a signal connection point on the electronic memory device and electrically connecting a first passive component between the signal connection point and a power connection point on the electronic memory device. The method further includes electrically connecting a second passive component between the power connection point and a ground connection point on the electronic memory device and electrically connecting a ground line of the exterior circuit to the ground connection point. The power connection point receives a conditioned voltage signal through the electrical connection between the signal connection point and the power connection point.

The present disclosure further provides a communications headset including a push-to-talk headset comprising a transducer, a speaker, a microphone and an electronic memory device. The electronic memory device is provided with a passive interface. The passive interface includes a signal connection point, a power connection point and a ground connection point on an electronic memory device. A first passive component forms an electrical connection between the signal connection point and the power connection point. A second passive component forms an electrical connection between the power connection point and the ground connection point. And the power connection point receives a conditioned voltage signal through the electrical connection between the signal connection point and the power connection point.

BRIEF DESCRIPTION OF THE DRAWINGS

The invention may be more completely understood in consideration of the following detailed description of various embodiments of the invention in connection with the accompanying drawings, in which:

FIGS. 4A-4B show voltage levels at a power connection point and a signal connection point as data is being read from an electronic memory device, when the electronic memory device is connected to an exterior circuit with a passive interface.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The present disclosure relates to a passive interface for electrically connecting an electronic memory device to an exterior circuit. The passive interface can result in decreased space requirements for an interface, greater design flexibility and, specifically, a smaller connecting cord between an electronic memory device and other parts of a circuit. Additionally, the passive interface can provide for decreased electrical lines and lower electrical energy, which can be valuable in an intrinsically safe system.

Figure 1:
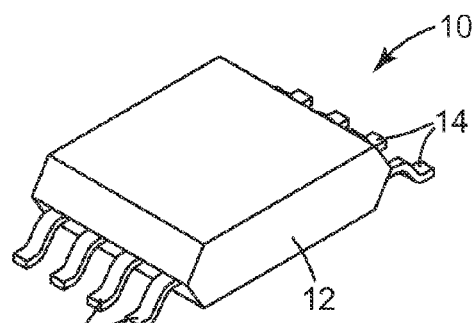
FIG. 1 shows an exemplary electronic memory device.

FIG. 1 shows an exemplary electronic memory device 10, as may be used with a passive interface. Electronic memory device 10 can be an integrated circuit (also known as an IC, chip, or microchip). Examples of types of electronic memory devices include: RAM, ROM, EPROM, EEPROM, FLASH and any other appropriate type of electronic memory device.

The body 12 of electronic memory device 10 can be made of semiconductor devices and electrical components, and can be manufactured in the surface of a substrate of semiconductor material. Pins 14 on electronic memory device 10 provide electrical connection points between electronic memory device 10 and an exterior circuit. An electronic memory device 10 may have any appropriate number of pins, for example: 3, 4, 8, 16, etc. Pins 14 often have designated functions including, but not limited to, power, ground, clock, control, data, data in and data out and other signals. A single electronic memory device 10 may have multiple power pins intended to be connected to multiple different power sources. An electronic memory device 10 may also have multiple data pins for serial or parallel communication. Some electronic memory devices 10 may have a single data pin for both receiving and transmitting data. Communication with an electronic memory device may be synchronous or asynchronous.

An electronic memory device 10 can be connected to an exterior circuit in a variety of ways. In some configurations where an electronic memory device 10 is a chip, it may be soldered to a circuit board, such that each pin 14 is electrically connected to a designated pad on a circuit board. Circuit board pads typically connect to traces, which electrically connect the pins 14 to other electronic components and parts of an exterior circuit. In other configurations, an electronic memory device 10 may be part of an apparatus that is connected by a cord to a base or exterior device, such as a headset connected to a radio, computer, mobile telephone, or other device. In this instance, a cord connecting the apparatus to the base or exterior device may include wires for each of the pins 14 in the electronic memory device 10 that are intended connect to an exterior circuit in the base device. This is described in further detail with respect to FIG. 5.

Figure 2:
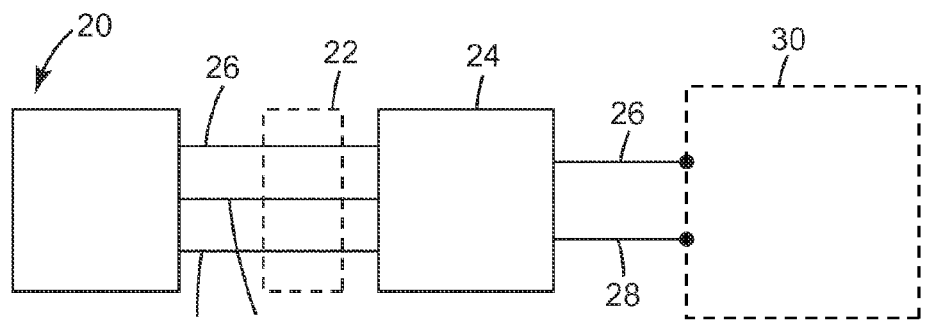
FIG. 2 shows a block diagram of a passive interface consistent with the present disclosure.

FIG. 2 shows a block diagram of a passive interface 24 for an electronic memory device 20 consistent with the present disclosure. In FIG. 2, electronic memory device 20 is shown to have a signal connection point 26, a power connection point 27 and a ground connection point 28. However, consistent with the present disclosure, an electronic memory device 20 may have multiple signal connection points 26, power connection points 27 and ground connection points 28, in addition to other connection points. Signal connection point 26 may be used for communication of any transient signal, for example, transmitting data, receiving data, both transmitting and receiving data, receiving a clock signal, or any other appropriate signal. Power connection point 28 can be configured as a direct current power connection point such that power connection point 28 is designed to be connected to a substantially stable voltage source. In such a configuration, power connection point 28 may be configured to receive any appropriate voltage level such as 1.8 V, 3.3 V, 5 V, or any other voltage, including voltage levels in the range of those listed. Ground connection point 28 can be electrically connected to a node in an exterior circuit with a constant value of zero volts, or some other voltage, typically a lower voltage level than that electrically connected to power connection point 27.

The traditional interface 22 required to connect an electronic memory device 20 to an exterior circuit 30 is shown. In such an interface 22, a separate connection to an exterior circuit 30 is required for the signal connection point 26, power connection point 27, and the ground connection point 28. In contrast, passive interface 24 consistent with the present disclosure requires only separate electrical connections outside of passive interface 24 for signal connection point 26 and ground connection point 28 to connect electronic memory device to an exterior circuit 30. In an exemplary embodiment consistent with the present disclosure, passive interface 24 utilizes only passive components, such as resistors, capacitors, and inductors.

Figure 3A:
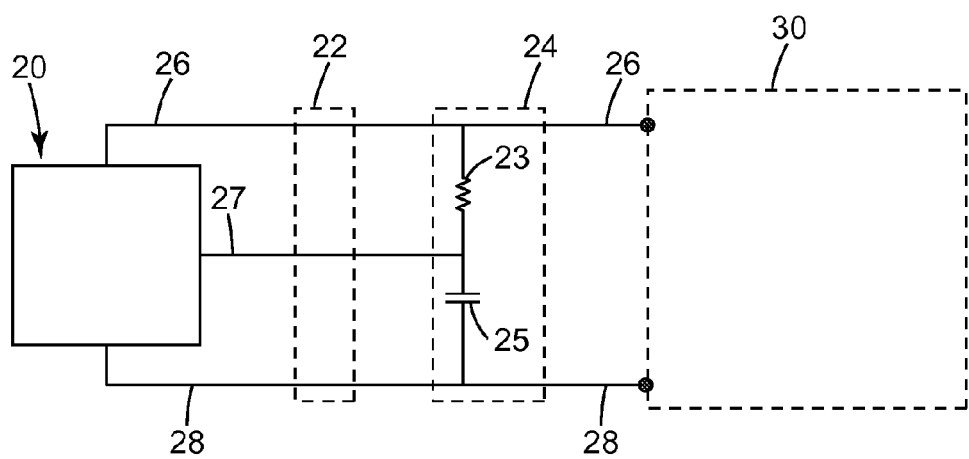
FIGS. 3A-3B show schematic drawings of passive interfaces for electrically connecting an electronic memory device to an exterior circuit.
Figure 3B:
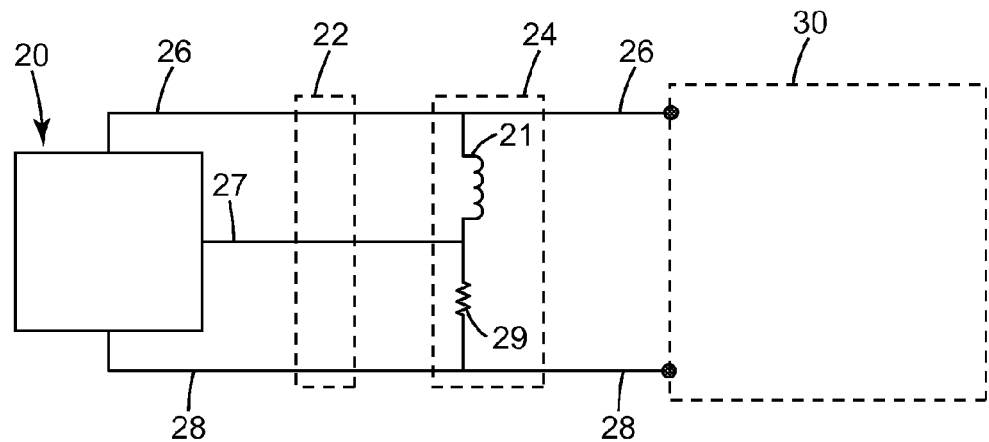

FIGS. 3A-3B show schematic drawings of a passive interface for electrically connecting an electronic memory device 20 to an exterior circuit. In FIG. 3A, electronic memory device 20 has signal connection point 26, power connection point 27, and ground connection point 28. Passive interface 24 includes a first passive component and a second passive component. In this configuration, the first passive component is a resistor 23 and the second passive component is a capacitor 25. The first passive component, resistor 23, is electrically connected between the signal connection point 26 and the power connection point 27. The second passive component, capacitor 25, is electrically connected between the power connection point 27 and ground connection point 28. Power connection point 27 receives a conditioned voltage signal through the electrical connection between the signal connection point 26 and the power connection point 27. In this exemplary embodiment, a conditioned voltage signal is generated by current flowing through the first passive component, resistor 23. The electronic memory device 20 is connected to an exterior circuit 30 by connecting signal connection point 26 to a signal line of the exterior circuit 30 and by connecting ground connection point 28 to a ground line of the exterior circuit 30.

Values for resistor 23 and capacitor 25 can be chosen using a variety of different methods. For example, in one configuration the electronic memory device 20 passive interface 24 can be used in a device where exterior circuit 30 requires only intermittent communication with electronic memory device 20. An example of such a device can include a headset, such as a push-to-talk headset, as described with respect to FIG. 5, in addition to other devices such as speaker microphones, in-ear headsets, and devices where it may be desirable to store and later read product performance information or other such characteristics. In such a device, the signal connection point 26 remains idle between periods of communication between the electronic memory device 20 and the exterior circuit 30. Such an idle time may be referred to as the "dwell time." During the dwell time, capacitor 25 recharges to increase the voltage level at power connection point 27, as described in further detail with respect to FIGS. 4A-4B. The dwell time necessary to allow the voltage level at power connection point 27 to increase to a level necessary for communication is defined as:

$$T=5*R*C$$

where "T" is the dwell time, "R" is the resistance value of resistor 23 in ohms (Ω), and "C" is the capacitance value of capacitor 25 in Farads (F).

As is apparent from the equation above, choosing low values for R and C can minimize the dwell time required. However, C is preferably selected to still be large enough to hold sufficient charge to complete a desired number of transactions over the signal connection point while maintaining a voltage level equal to or greater than the minimum operating voltage required by the electronic memory device 20 for transmitting and receiving signals over signal connection point 26. Factors to consider when choosing a value for C include the minimum operating voltage of the electronic memory device, the current transmitted over the signal connection point 26 when communicating with the electronic memory device 20 and the frequency of a signal being transmitted over signal connection point 26. Capacitance value C can be a range of appropriate values, such as 0.1 µF to 1.0 F, or any value in between.

Likewise, R can be selected to be as small as reasonably possible to minimize dwell time. However, other factors may be taken into account when choosing a value for R. For example, R is preferably large enough to provide isolation of the signal connection point 26 from the power connection point 27 to allow a signal being communicated over signal connection point 26 to achieve the minimum voltage out low (VOL) level required for the electronic memory device to function properly. The logic level low voltage (VL) of the electronic memory device specification should also be taken into account.

Resistance value R can be a range of appropriate values, such as in the range of 1Ω to 100 kΩ.

FIG. 3B shows a configuration where passive interface 24 includes a first passive component and a second passive component. In this configuration, first passive component is an inductor 21 and second passive component is a resistor 29. The first passive component, inductor 21, is electrically connected between the signal connection point 26 and the power connection point 27. The second passive component, resistor 29, is electrically connected between the power connection point 27 and ground connection point 28. Power connection point 27 receives a conditioned voltage signal through the electrical connection between the signal connection point 26 and the power connection point 27. In this exemplary embodiment, a conditioned voltage signal is generated by current flowing through first passive component, inductor 21. The electronic memory device 20 is connected to an exterior circuit 30 by connecting signal connection point 26 to a signal line of the exterior circuit 30 and by connecting ground connection point 28 to a ground line of the exterior circuit 30.

For the configuration shown in FIG. 3B, dwell time is calculated as shown below:

$$T=(5*L)/R$$

where "T" is the dwell time, "L" is the inductance of inductor 21 in henries (H), and "R" is the resistance value of resistor 29 in ohms.

As with FIG. 3A, values for inductor 21 and resistor 29 in FIG. 3B can be chosen to minimize dwell time required between communication periods with electronic memory device 20. Here, to minimize the dwell time required, L is preferably as low of a value as possible and R is preferably as high of a value as possible. Additional factors in choosing a value for L that should be taken into account include ensuring that the voltage difference across L is large enough to provide isolation of the signal connection point 26 from the power connection point 27 to allow a signal being communicated over signal connection point 26 to achieve the VOL level required for the electronic memory device to function properly. The VL of the electronic memory device specification should also be taken into account. Inductance value L can be a range of appropriate values, such as in the range of 1 mH to 1 H.

When choosing a value for R, factors include ensuring R is large enough to hold the voltage level at power connection point high enough to complete a desired number of transactions over the signal connection point while maintaining a voltage level equal to or greater than the minimum operating voltage required by the electronic memory device 20 for transmitting and receiving signals over signal connection point 26. Factors to consider when choosing a value for R include the minimum operating voltage of the electronic memory device, the current transmitted over the signal connection point 26 when communicating with the electronic memory device 20 and the frequency of a signal being transmitted over signal connection point 26. Resistance value R can be a range of appropriate values, such as in the range of 10Ω to 1 kΩ.

In both FIGS. 3A and 3B, to electrically connect electronic memory device 20 to an exterior circuit, only two connection points are required, compared with three connection points in a traditional interface. It will be readily understood by one of skill in the art that this interface can be used for an electronic memory device with any desired number of pins to achieve similar advantages. It will also be understood by one of skill in the art that a combination of passive electrical components can be used in place of either the first passive electrical component or the second passive electrical component. For example, multiple components in parallel, in series or both could be used in place of resistor 23, capacitor 25, inductor 21 or resistor 29.

FIG. 4A shows voltage levels at a power connection point and a signal connection point as data is being read from an electronic memory device, when the electronic memory device is connected to an exterior circuit with a passive interface as shown in FIG. 3A. Axis 40 represents time and axis 42 represents voltage level. In FIG. 4A, the time scale for axis 40 is 20 ms per large division 40a. The voltage scale for axis 42 is 500 mV per large division 42a. Signal voltage level 44 is monitored at signal connection point 26. Power voltage level 46 is monitored at power connection point 27. During time periods where signal voltage level 44 oscillates up and down, a communication period is occurring between electronic memory device and an exterior circuit through signal connection point 26. During a communication period, power voltage level 46 gradually decreases due to capacitor 25 losing charge. When no communication is occurring over signal connection point 26, the data voltage level appears high. During that time, capacitor 25 recharges which increases power voltage level 46.

Figure 4B:
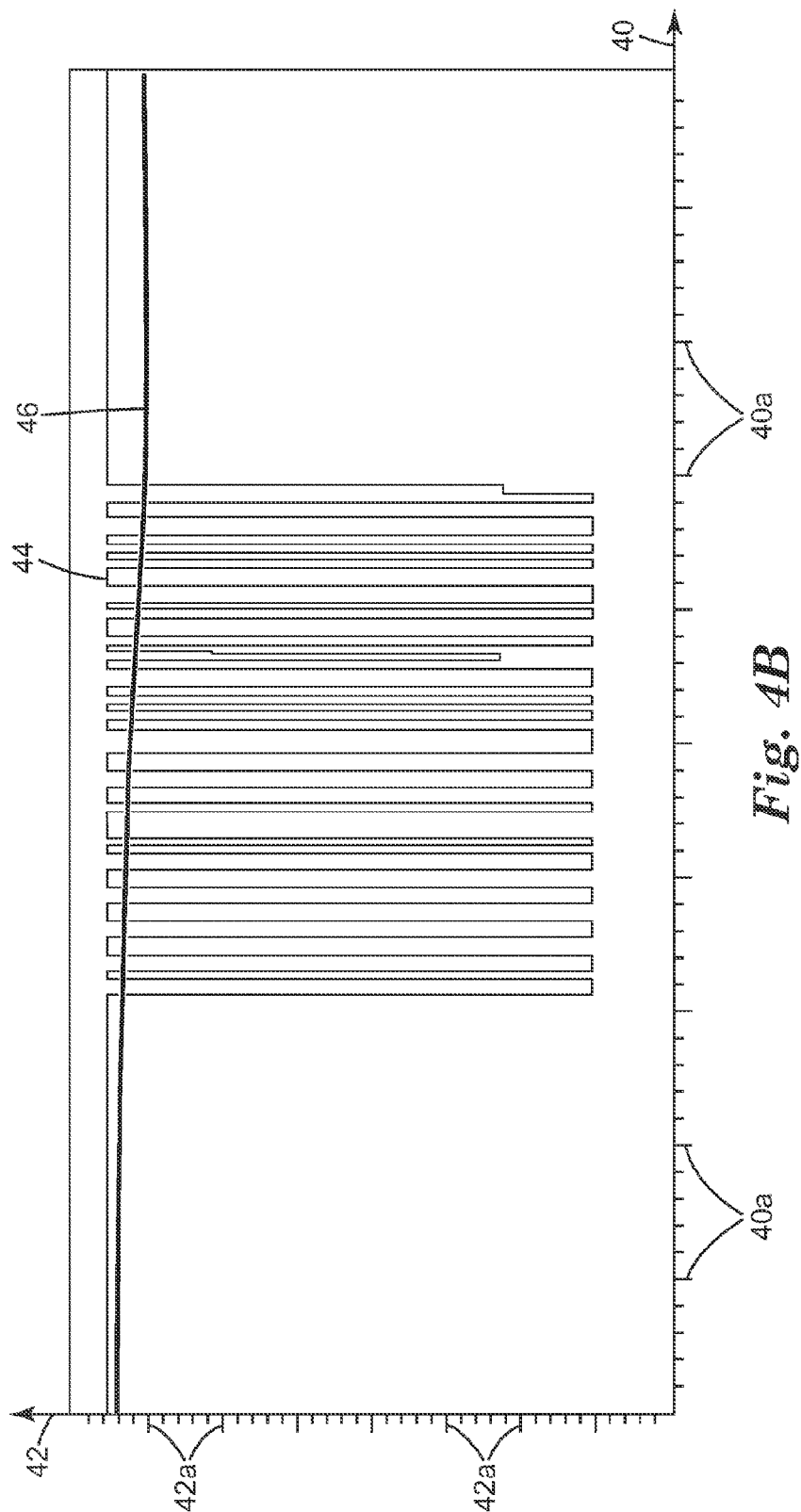

FIG. 4B shows voltage levels at a power connection point and a signal connection point as data is being read from an electronic memory device, as in FIG. 4A, but shows a smaller time period. In FIG. 4B, the time scale for axis 40 is 200 μs per large division 40a. The voltage scale for axis 42 is 500 mV per large division 42a. As with FIG. 4B, during a communication period, power voltage level 46 gradually decreases due to capacitor 25 losing charge. In this illustrated embodiment, if the communication period were to continue indefinitely, power voltage level 46 would decrease below the minimum operating voltage level required by an electronic memory device.

Figure 5:
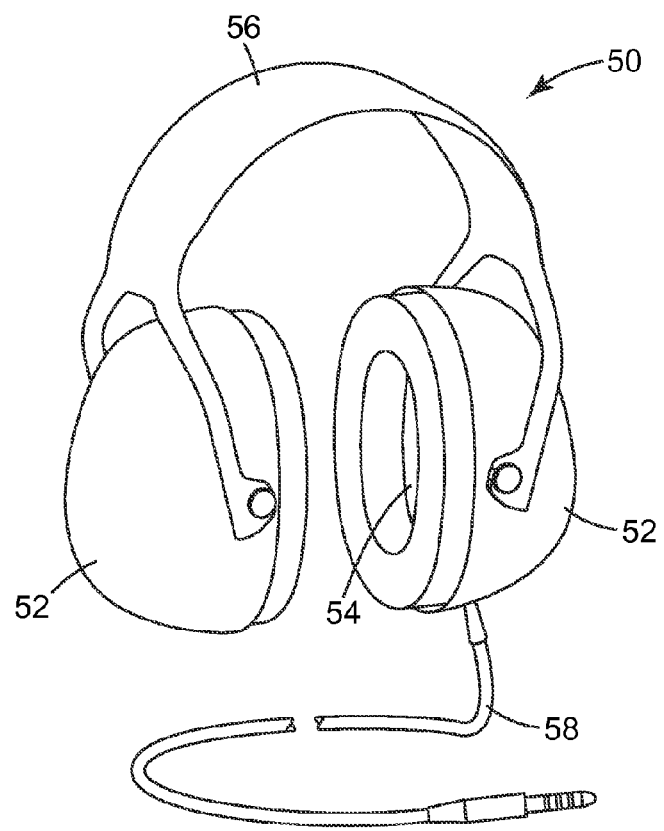
FIG. 5 shows an exemplary headset in which a passive interface for connecting an electronic memory device to an exterior circuit may be used.

FIG. 5 shows an exemplary headset 50 in which a passive interface for connecting an electronic memory device to an exterior circuit may be used. Headset 50 includes ear cups 52 which can actively or passively protect a wearer's ears from environmental noise. Ear cups 52 can be connected by head band 56 to secure them to a wearer's ears. Speakers 54 are incorporated into ear cups 52 to amplify received sound for a wearer to hear. Such a headset may be a push-to-talk headset further including a microphone (not shown), where a wearer can press a button (not shown) before talking to activate the microphone. When the wearer stops pressing the button, the microphone will discontinue reception of the wearer's voice. Power and data cord 58 electrically connects the headset 50 to a radio or other communication device.

An electronic memory device with a passive interface consistent with the present disclosure may be incorporated into headset 50 or a similar headset, such as an in-ear headset. Electronic memory device can be used to store information about headset 50 such as information related to age, maintenance history, exposure, service dates, product history or type of headset 50. When a headset is then connected to an exterior device, the stored information can be transmitted through passive interface and data and power cord 58 to the exterior device. The exterior device identify headset 50 to determine if it is the correct headset, requires maintenance, is due for replacement, or any other desired piece of information.

When an electronic memory device is connected to an exterior circuit using a passive interface consistent with the present disclosure, this reduces the number of electrical connections required to connect the electronic memory device to an exterior circuit, such as one in a radio or other communication device. Such a use of a passive interface can reduce the number of wires required for data and power cord 58. Additionally, the reduced electrical connections can increase ease of meeting requirements for intrinsically safe applications used in hazardous environments. Reduced numbers of electrical connections can also decrease need for connector, reduce probability of electrical failure, and reduce cost of materials for and manufacture of a device

EXAMPLE

A passive interface for an electronic memory device was constructed and data was written to and read from the electronic memory device. The memory device used was a UNI/O® Serial EEPROM with 1 Kbit of memory made by Microchip Technology Inc. of Chandler, Ariz. The interface shown in FIG. 3A was used to connect the electronic memory device to an exterior circuit. The resistor had resistance of 10 kΩ. The capacitor had a capacitance of 3 μF. The exterior circuit communicated with the electronic memory device at the maximum frequency rate specified for the device, 100 kHz. The selected resistor and capacitor values ensured the power connection point received sufficient energy for the device to transmit the entire contents of the memory (1 Kbit) in approximately 1 second. Using the dwell time equation specified above:

$$T = 5*R*C$$

where "T" is the dwell time, "R" is the resistance value of resistor in ohms, and "C" is the capacitance value of capacitor in Farads, the equation with the appropriate values is:

$$T = 5*(3 \text{ μF})*(10 \text{ kΩ})$$

The resulting dwell time required to recharge the voltage level at the power connection point was about 150 milliseconds.

Although the present disclosure has been described with reference to preferred embodiments, those of skill in the art will recognize that changes made be made in form and detail without departing from the spirit and scope of the present disclosure.

What is claimed is:

1. A passive interface for an electronic memory device, the passive interface comprising:
    a signal connection point, a power connection point and a ground connection point on an electronic memory device;
    a first passive component forming an electrical connection between the signal connection point and a second passive component;
    the second passive component forming an electrical connection between the ground connection point and the first passive component;
    wherein the power connection point for the electronic memory device is derived at a node formed solely by the electrical connection between the first passive component and the second passive component;
    wherein the power connection point receives power solely from a conditioned voltage signal through the electrical connection between the signal connection point and the power connection point;
    wherein the signal connection point is a transient signal connection point and wherein the power connection point is a direct current power connection point.

2. The passive interface of claim 1, wherein the passive interface is part of an intrinsically safe system.

3. The passive interface of claim 1, wherein the first passive component comprises a resistor and the second passive component comprises a capacitor.

4. The passive interface of claim 3, wherein the resistor has an impedance between 1 ohm and 100 k ohms.

5. The passive interface of claim 3, wherein the capacitor has a capacitance between 0.1 μfarads and 1.0 farad.

6. The passive interface of claim 1, wherein the first passive component comprises an inductor and the second passive component comprises a resistor.

7. The passive interface of claim 6, wherein the inductor has an inductance between 0.001 henries and 1.0 henry.

8. The passive interface of claim 6, wherein the resistor has resistance between 10 ohms and 1 k ohms.

9. The passive interface of claim 1, wherein the data is transmitted through the signal connection point.

10. The passive interface of claim 1, wherein the signal connection point is an input and output connection point.

11. The passive interface of claim 1, wherein the signal connection point is a clock connection point.

12. The passive interface of claim 1, wherein the electronic memory device is capable of transmitting and receiving data through the signal connection point.

13. The passive interface of claim 1, wherein the passive interface is comprised in a headset.

14. The passive interface of claim 13, wherein the headset is a push-to-talk headset.

15. A method of connecting an exterior circuit to an electronic memory device, the method comprising:
- electrically connecting a signal line of the exterior circuit to a signal connection point on the electronic memory device;
- electrically connecting a first passive component between the signal connection point and a second passive component;
- electrically connecting the second passive component between a ground connection point and the first passive component;
- electrically connecting a ground line of the exterior circuit to the ground connection point;
- wherein the power connection point for the electronic memory device is derived at a node formed solely by the electrical connection between the first passive component and the second passive component;
- wherein the power connection point receives power solely from a conditioned voltage signal through the electrical connection between the signal connection point and the power connection point;
- wherein the signal connection point is a transient signal connection point and wherein the power connection point is a direct current power connection point.

16. The method of claim 15, wherein the passive interface is part of an intrinsically safe system.

17. The method of claim 15, wherein the first passive component comprises a resistor and wherein the second passive component comprises a capacitor.

18. The method of claim 15, wherein the first passive component comprises an inductor and wherein the second passive component comprises a resistor.

19. The method of claim 15, wherein the electronic memory device is capable of transmitting and receiving data through the signal connection point.

20. The method of claim 15, wherein the passive interface is comprised in a headset.

21. The method of claim 15, wherein the electronic memory device is a serial EEPROM.

22. The method of claim 20, wherein the electronic memory device is used to store information related to at least one of: age, maintenance history, exposure, and type.

23. A communications headset comprising:
- a push-to-talk headset comprising a transducer, a speaker, a microphone and an electronic memory device;
- wherein the electronic memory device is provided with a passive interface;
- wherein the passive interface comprises:
  - a signal connection point, a power connection point and a ground connection point on an electronic memory device;
  - a first passive component forming an electrical connection between the signal connection point and a second passive component;
  - the second passive component forming an electrical connection between the ground connection point and the first passive component; and
  - wherein the power connection point for the electronic memory device is derived at a node formed solely by the electrical connection between the first passive component and the second passive component;
- wherein the power connection point for the electronic memory device receives power solely from a conditioned voltage signal through the electrical connection between the signal connection point and the power connection point;
- wherein the signal connection point is a transient signal connection point and wherein the power connection point is a direct current power connection point.

* * * * *